(12) United States Patent
Shingai et al.

(10) Patent No.: US 7,367,381 B2
(45) Date of Patent: May 6, 2008

(54) FAN MOTOR

(75) Inventors: Hiroyuki Shingai, Tokyo (JP); Shinya Minakuchi, Tokyo (JP)

(73) Assignee: NIDEC Copal Corporation, Tokyo (JP)

( * ) Notice: Subject to any disclaimer, the term of this patent is extended or adjusted under 35 U.S.C. 154(b) by 1253 days.

(21) Appl. No.: 09/313,266

(22) Filed: May 18, 1999

(65) Prior Publication Data

US 2002/0056547 A1 May 16, 2002

(30) Foreign Application Priority Data

May 21, 1998 (JP) ............................................. 10-140025

(51) Int. Cl.
*H05K 7/20* (2006.01)

(52) U.S. Cl. ...................... 165/80.3; 165/121; 165/185; 361/697

(58) Field of Classification Search ................ 165/80.3, 165/121, 122; 361/697; 415/175, 176, 177, 415/178, 213.1, 214.1; 417/423.15, 360
See application file for complete search history.

(56) References Cited

U.S. PATENT DOCUMENTS

| | | | | |
|---|---|---|---|---|
| 3,154,242 A | * | 10/1964 | Harris | 417/360 |
| 4,513,812 A | * | 4/1985 | Papst et al. | 165/121 X |
| 4,538,967 A | * | 9/1985 | Furukawa | 417/360 |
| 4,734,016 A | * | 3/1988 | Sailer | 417/360 |
| 5,291,063 A | * | 3/1994 | Adishian | 165/80.3 X |
| 5,392,193 A | * | 2/1995 | Robertson, Jr. et al. | 165/80.3 X |
| 5,475,564 A | | 12/1995 | Chiou | |
| 5,573,383 A | * | 11/1996 | Uemura et al. | 417/360 |
| 5,676,199 A | | 10/1997 | Lee | |
| 5,835,347 A | | 11/1998 | Chu | |
| 5,864,464 A | | 1/1999 | Lin | |

FOREIGN PATENT DOCUMENTS

| | | |
|---|---|---|
| JP | 10-326986 | 12/1998 |
| JP | 11-75340 | 3/1999 |

* cited by examiner

*Primary Examiner*—Leonard Leo
(74) *Attorney, Agent, or Firm*—McGinn IP Law Group, PLLC

(57) ABSTRACT

A fan motor, which is mounted on an upper surface of an electronic component to cool the electronic component. The fan motor includes a fan motor and a thermally dissipating surface to which the fan motor is fixed. The fan motor includes a motor portion having cooling blades and an attaching plate having leg portions formed in its peripheral portions to fix the motor portion to the thermally dissipating surface. The thermally dissipating surface has a hole portion substantially as large as the attaching plate, and recessed portions capable of accommodating at least the leg portion therein. The attaching plate is passed through the hole portion toward the rear surface side and is rotated so that the leg portions are accommodated in the recessed portions.

14 Claims, 4 Drawing Sheets

FAN MOTOR

BACKGROUND OF THE INVENTION

1. Field of the Invention

The present invention relates to a fan motor, which is mounted on an upper surface of an electronic component to be cooled. In particular, the present invention relates to the structure of a fan motor which is used for cooling a CPU in a personal computer, a fan motor used in a compact portable electronic equipment, etc.

2. Related Art

Compact and high-performance electronic equipment has been developed according to the recent progress in electronic technology. The electronic equipment requires forcible cooling using a fan motor or the like since the electronic components are integrated therein with high density, and the heat generated therefrom cannot be released sufficiently by natural air cooling.

The degree of integration has increased particularly in CPUs, and there has arisen a need to provide a fan motor and a heat sink on an upper portion of the CPU. The typical structure of a fan motor is shown in FIG. 8.

In FIG. 8, reference numeral 50 denotes a cooling plate, (e.g., a thermally dissipating surface) which is secured to a CPU, a RAM, or the like. The cooling plate 50 is provided at it central portion with a cooling hole 51 for allowing cooling air from a fan motor 100 to pass therethrough. On the other hand, the fan motor 100 has an attaching plate 120 which is disposed on and attached to a lower portion of a cooling fan section (a motor main body portion and a cooling blade portion) 110.

The fan motor 100 is fixed to the cooling plate 50 in such a manner that the attaching plate 120 is placed on the upper surface of the cooling plate 50, and then the attaching plate 120 is fixed to the cooling plate 50 using screws extending downwardly.

A signal line (lead wires) 150 for supplying a motor drive signal is led from the attaching plate 120 and secured to the cooling plate 50 using an adhesive agent, a thermosetting resin, or the like as shown by 200 in FIG. 8. Alternatively, the signal line 150 may be clamped by a clamp member that is fixed to the cooling plate 50 using screws.

In recent years, the demand directed to making the electronic equipment compact in size has been increased more and more, and a compact and thin fan motor portion has been required for the electronic equipment accordingly. Various attempts have been made to make the motor portions compact and thin, but are still insufficient to satisfy the recent increased demand requiring a more compact, thinner fan motor portions.

Besides, it is also pointed out that the attachment of the signal line using an adhesive agent or the like requires the increased number of manufacturing steps, and is deficient in reliability. The attachment of the signal line using the clamp member makes the structure complex, and increases the manufacturing cost.

SUMMARY OF THE INVENTION

It is an object of the present invention to overcome the above-described problems and provide a fan motor which is thin.

To reduce the overall thickness of a fan motor, the present invention provides a structure for mounting a first plate member associated with a motor portion of a fan motor onto a second plate member having a first side and a second side opposite from said first side. The structure includes an opening portion formed through the second plate member, at least one recessed portion provided in the first side of the second plate member and located outwardly with respect to the opening portion, and at least one leg portion provided to the first plate member, and received by the recessed portion so that the motor portion is at least partially located in the second side.

A fan motor according to an embodiment of the present invention comprises: a cooling plate to be mounted to an electronic component; a fan motor attached to the cooling plate; and an attaching plate in which a leg portion for fixing the fan motor to the cooling plate is provided in a peripheral portion of the attaching plates. The cooling plate has a hole portion at least as large as the attaching plate, and a recessed portion that is formed on an attaching surface side of the cooling plate to the electronic component and that accommodates at least the leg portion of the attaching plate therein.

The fan motor is assembled such that the attaching plate is passed through the hole portion; the attaching plate is rotated so that the leg portion is accommodated in the recessed portion, and then the leg portion is fixed to the cooling plate fan from the attaching surface side.

A fan motor according to an embodiment of the present invention is characterized in that a recessed portion capable of accommodating an attaching plate of a fan motor is provided in a cooling plate of a heat sink on a side thereof which is to be mounted on an electronic component, and the attaching plate is fixed from an attaching surface side of the cooling plate to the electronic component in a state that the attaching plate is accommodated in the recessed portion.

In each of the fan motors, it is preferable that the cooling plate has a retaining portion capable of retaining a signal line, the retaining portion including a tongue portion provided in a central portion thereof and a space portion surrounding the tongue portion to permit the signal line to pass therethrough across the tongue portion, and wherein the retaining portion retains the signal line by allowing the signal line to pass between the tongue portion and the cooling plate.

A fan motor according to an embodiment of the present invention comprises: a motor portion having a fan blade, a casing (e.g., a thermally dissipating surface) having a central portion to which the motor portion can be attached, the central portion defining an air blowing hole, and an attaching plate for holding the motor portion. The attaching plate has an attaching leg a distal end portion of which is located radially outwardly relative to the air blowing hole when the motor portion is attached to the casing. The casing has on its bottom side an attaching recessed portion capable of accommodating at least the distal end portion of the attaching leg portion.

The fan motor is assembled such that the motor portion is accommodated in the air blowing hole from the bottom side of the casing, and then the attaching leg portion is fixed to the casing in a state that the attaching leg portion is accommodated in the accommodating recessed portion.

In the above-described arrangements, since the thickness of the fan-motor attaching plate is not added to the thickness of the heat sink, it is possible to make a fan motor thin. Further, it is possible to positively prevent the lifting up of the signal line with a simple arrangement. Since the thickness of the fan attaching member is not added to the thickness of the fan motor, it is possible to provide a thin fan motor.

The present disclosure relates to the subject matter contained in Japanese patent application No. Hei. 10-140025 (filed on May 21, 1998), which is expressly incorporated herein by reference in its entirety.

DESCRIPTION OF THE PREFERRED EMBODIMENT

Figure 1:
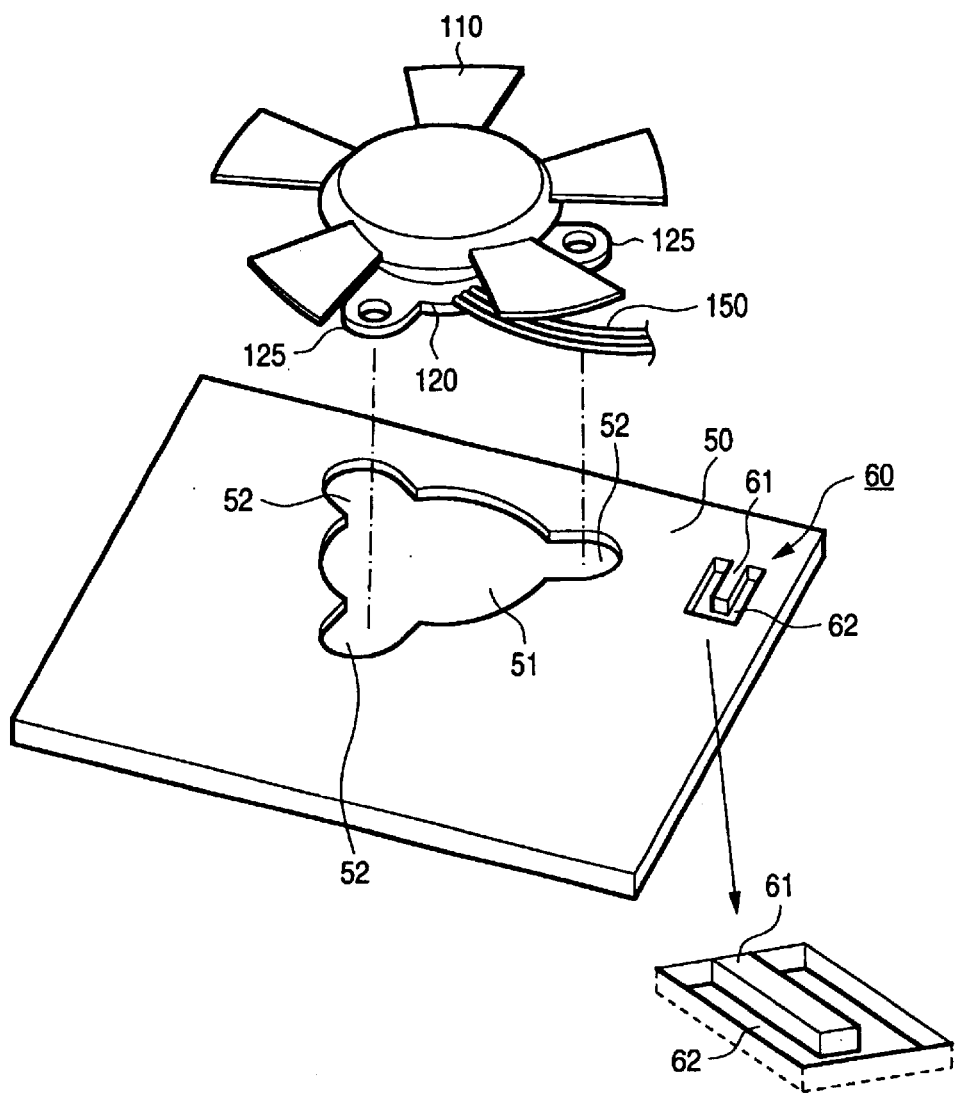
FIG. 1 is a diagram explaining the outline of an embodiment of the present invention.
Figure 2:
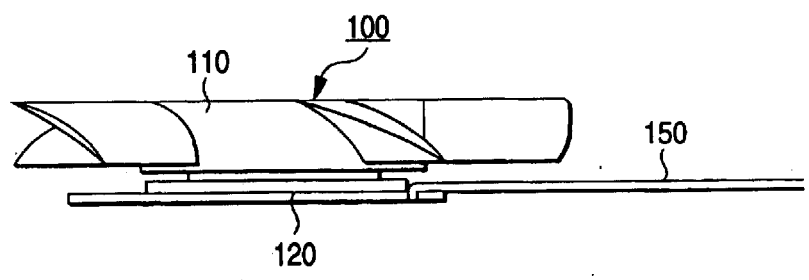
FIG. 2 is a diagram illustrating the structure of a fan motor portion in accordance with the embodiment.

Referring now to the drawings, a detailed description will be given of the embodiments of the present invention.

First Embodiment of the Invention

FIGS. 1 to 5 shows fan motor according to a first embodiment of the present invention.

This embodiment is featured as follows: A hole substantially similar to but slightly larger than an attaching plate of a fan motor is formed in a bottom plate, i.e. a cooling plate of a heat sink. The attaching plate of the fan motor is passed through this hole to be located at the rear side of the heat sink, and then rotated and positioned to the attaching position on the rear side of the heat sink. The heat sink has a recessed portion (recessed portions) on the rear side thereof, each having a depth corresponding to the thickness of the attaching plate of the fan motor. The attaching plate of the fan motor at the attaching position is received by and accommodated in the recessed portion(s) of the heat sink. The fan motor is fixed to the heat sink under this condition.

Figure 8:
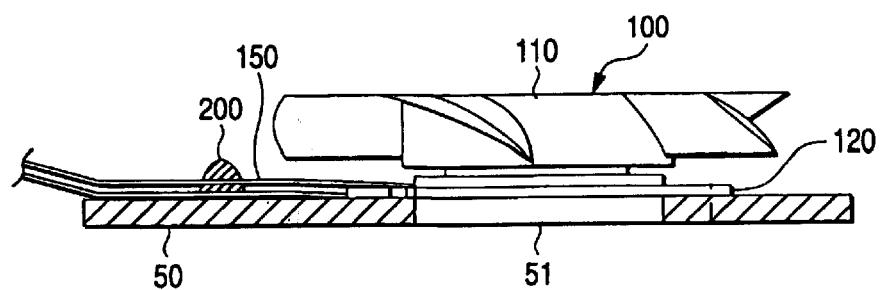
FIG. 8 is a diagram illustrating a typical structure of a related fan motor.

A signal line (lead wires) for driving the fan motor is passed laterally through a bridge portion in a hole or a recessed portion provided in the heat sink, thereby preventing the lifting up of the signal line and preventing the contact of the blades with the signal line. Hereafter, a description will be given specifically with reference to FIG. 1 to 5. In the drawings, arrangements that are similar to those shown in FIG. 8 referred to before are denoted by the same reference numerals.

Reference numeral 100 denotes a fan motor. The fan motor 100 is attached to an attaching plate 120. Three leg portions 125 are provided at equal angular intervals in peripheral portion of the attaching plate 120 for fixing the fan motor 100 to a cooling plate 50. An attaching hole 126 is formed in a substantially central portion of a distal end portion of each leg portion 125.

The cooling plate 50 is secured to an upper surface of an electronic component to be cooled, e.g., a CPU or an MPU. The cooling plate 50 is provided with a cooling hole 51 designed to permit the attaching plate 120 to pass therethrough toward the rear surface side of the cooling plate 50. Three attaching recessed portions 55 each having a depth at least as large as the thickness of the leg portion 125 are provided on the rear surface side of the cooling plate 50.

Figure 4:
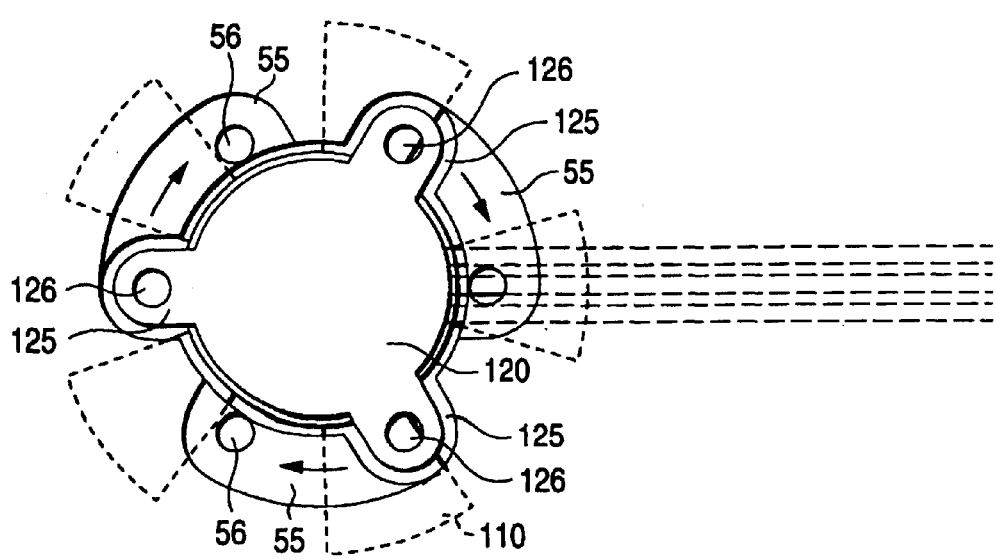
FIGS. 4 and 5 are diagrams explaining the procedure for fixing the fan motor to the cooling plate in this embodiment.
Figure 5:
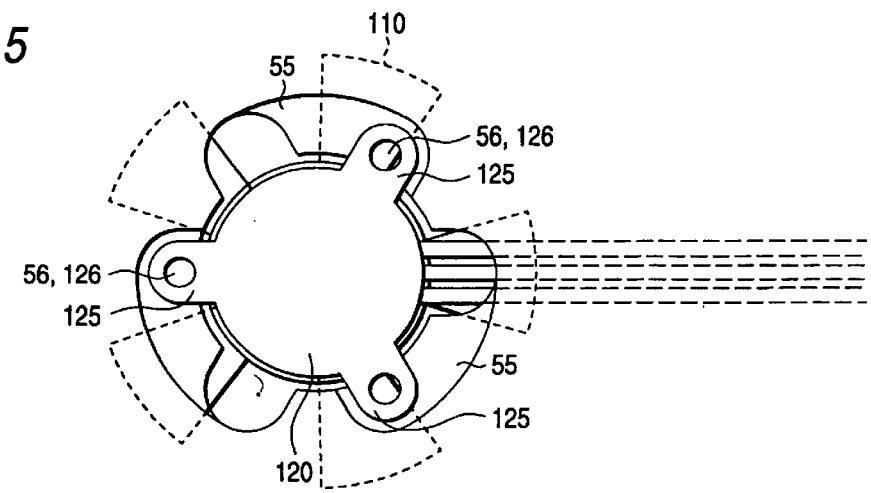

The cooling hole 51 is formed with notched portions 52 for permitting the respective leg portions 125 to pass therethrough. As shown in FIGS. 4 and 5, the attaching recessed portion 55 on the rear surface side is in the form of an arcuate groove continuing from the corresponding notched portion 52, so that the leg portion 125, which has passed through the notched portion 52, can be rotated along the groove through a predetermined angle to the attaching position. The attaching recessed portion 55 is provided with a tapped hole 56 which mates with the attaching hole 126 when the leg portion 125 has been rotated through the predetermined angle to the attaching position. With this arrangement, the fan motor 100 can be attached to the cooling plate 50 in such a manner that the attaching holes 126 and the tapped holes 56 are aligned with each other after the leg portions 125 are accommodated in the attaching recessed portions 55, and then screws are fastened to the tapped holes 56 from the rear surface side of the plate 50.

It should be noted that the attaching recessed portions 55 are not limited in configuration to those shown in FIGS. 4 and 5. For example, they may not necessarily continue from the notched portions 52 as far as they are recessed portions capable of accommodating the leg portions 125. Further, the method of fixing the leg portions 125 is also not limited to the threaded engagement with the tapped holes 56, and an arrangement may be alternatively employed such that fixing holes are provided instead of the tapped holes, nuts are provided over the fixing holes, and the screws are passed through the attaching holes 126 and the fixing holes from the rear surface side and are fixed by being threadedly engaged with the nuts. Still alternatively, the holes aligned with each other may be fixed together by eyelets or the like. Furthermore, the two members may be fixed to each other by caulking or the like. Any suitable fixing method is applicable.

Figure 3:
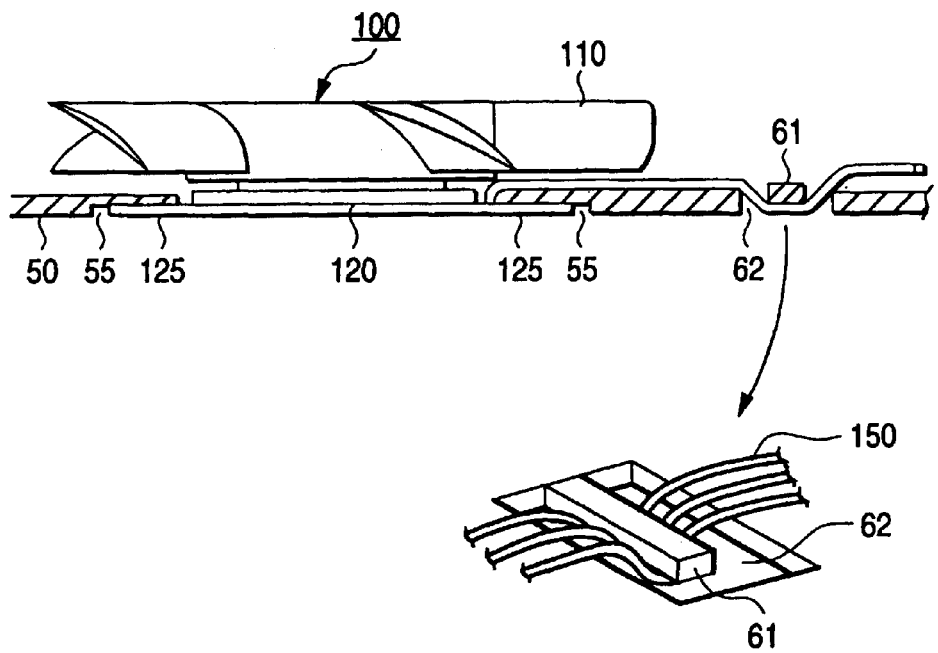
FIG. 3 is a diagram illustrating a cross section of a cooling plate in accordance with the embodiment.

As shown in FIG. 1, a signal-line retaining portion 60 is provided for retaining the signal line 150 at a position spaced apart a predetermined distance from the cooling hole 51 in the cooling plate 50. This signal-line retaining portion 60 includes a hole portion 62 in which the signal line 150 can be inserted, and a tongue portion 61 projecting in a central portion of the hole portion 62 for retaining the signal line. As shown in FIG. 3, the signal line 150 is inserted in the hole portion 62, and is passed under the lower side of the tongue portion 61, thereby securing the signal line 150.

It is preferable to form a lower portion of the tongue portion 61 into an arcuate shape to provide a slightly thicker distal end portion and a thin intermediate portion, in order for the tongue portion 61 to more positively retain the signal line and more positively prevent the removal of the signal line. In addition, instead of forming the hole portion 62, this signal-line retaining portion 60 may be formed by a recessed portion (cavity portion) insofar as it is capable of allowing the signal line 150 to pass under the lower side of the tongue portion 61.

Hereafter, a description will be given of a method of attaching the fan motor 100 to the cooling plate 50 in accordance with this embodiment configured as described above.

First, the attaching plate 120 of the fan motor 100 is inserted in the cooling hole 51 of the cooling plate 50 of the heat sink, so that the attaching plate 120 is located at the rear side of the cooling plate 50.

Subsequently, the attaching plate 120 of the fan motor 100 is rotated along the attaching recessed portions 55, and is positioned to the attaching position on the cooling plate 50.

Then, the attaching plate 120 of the fan motor 100 is fixed to the cooling plate 50 (by screwing, caulking, eyeleting, etc.).

Finally, the signal line (lead wires) 150 is passed through the hole or cavity portion 62 across the lower side of the tongue portion 61 to be retained at the signal-line retaining portion 60.

In accordance with this embodiment described above, the attaching plate can be accommodated in the recessed portions provided in the bottom surface of the heat sink (cooling plate). Therefore, the attaching plate can be attached to the heat sink such that the thickness of the fan-motor attaching plate is not added to the thickness of the heat sink (cooling plate), which contributes to making a fan motor thin.

In particular, in the case of a fan which is mounted on a high-speed CPU chip or the like generating the larger amount of heat, the overall thickness is the sum of the thickness of the CPU chip, the thickness of the heat sink portion and the thickness of a substrate on which they are mounted, so that the demand for a thin heat sink portion, in particular, is high. By adopting the above-described arrangement, it is possible to meet the demand for a thin heat sink portion without deteriorating the performance of the heat sink.

Further, it is possible to positively prevent the lifting up of the signal line with a simple arrangement. In particular, since the signal line can be retained without using a particular jig after the fan motor is fixed to the cooling plate, the signal line (lead wires) can be fixed irrespective of the size of a connector or the like.

Further, since the fan motor can be attached from the rear surface side, the fan motor can be easily attached to the cooling plate without being obstructed by the cooling fan of the fan motor.

Second Embodiment

In the above, a description has been given of an example of a fan motor, in which the fan motor is attached to the heat sink (cooling plate). The second embodiment is directed to a fan motor per se since a thinner fan motor is similarly required for making an electronic equipment, such as a portable electronic equipment, thinner and more compact.

Figure 6:
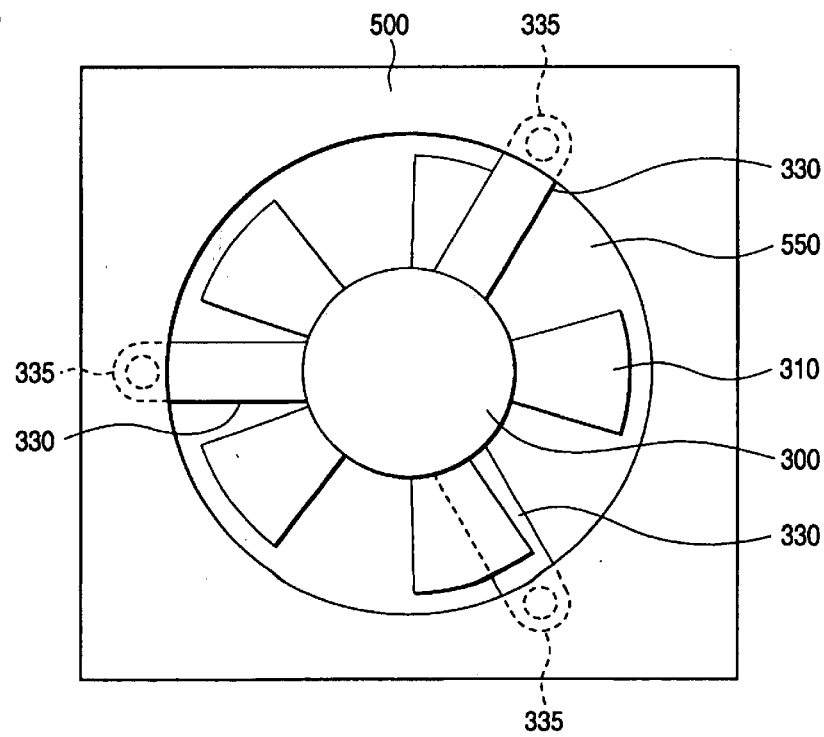
FIG. 6 is a top plan view of a fan motor in accordance with a second embodiment of the present invention.
Figure 7:
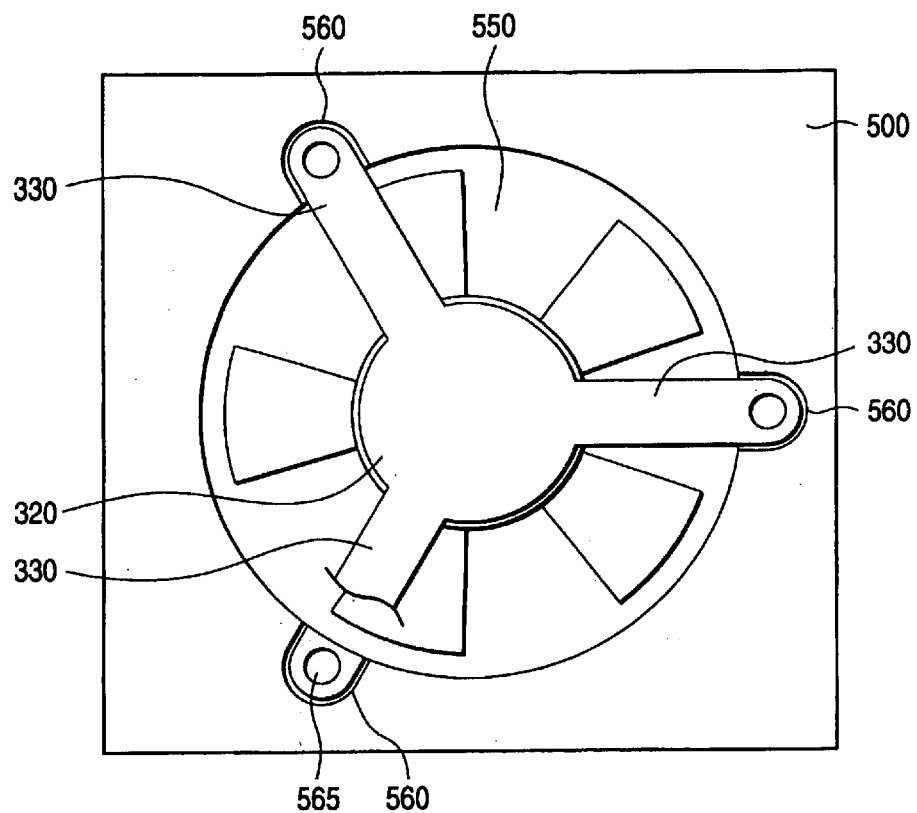
FIG. 7 is a bottom view of the fan motor in accordance with the second embodiment.

Referring to FIGS. 6 and 7, a description will be given of the second embodiment of the present invention.

If the attaching plate, to which a motor body and a blade portion of the fan motor are attached, is directly fixed to an upper portion of a casing of the fan motor, the thickness of the motor portion and the attaching portion is added to the thickness of the casing portion, and thus the overall thickness is large. Accordingly, similarly to the first embodiment, the second embodiment employs a recessed portion (recessed portions) capable of accommodating attaching and fixing portions of the attaching plate in a bottom portion (a rear surface side) of the fan motor casing. The attaching and fixing portions of the attaching plate are accommodated in the recessed portions of the fan motor casing. Consequently, the overall thickness of the fan motor can be made a smaller one of the sum of the thickness of the casing and the motor portion and the sum of the attaching plate and the motor portion at maximum. Hence, in a case where the casing is formed by a plate-like member to which the attaching plate can be fixed, the overall thickness of the fan motor can be reduced to the sum of the thickness of the attaching plate and the motor portion.

In the second embodiment shown in FIGS. 6 and 7, reference numeral 300 denotes a motor portion; 310 denotes a blade portion of the motor; and 320 denotes an attaching plate for attaching the motor portion 300 to a casing 500. The attaching plate 320 is provided with three radially-projecting attaching legs 330 arranged at equal angular intervals. Attaching holes 335 are provided in distal end portions of the attaching legs 330.

The casing 500 is formed of a plate-like member, to which the motor portion 300 is attached. An air blowing hole 550 of a diameter slightly larger than the diameter of the blade portion 310 of the motor 300 is provided in a central portion of the casing 500. Further, attaching recessed portions 560 capable of accommodating the arm portions 330 of the attaching plate and having a depth at least as large as the thickness of the attaching plate 320 are provided in a bottom surface portion of the casing 500. Tapped holes are provided in the attaching recessed portions 560.

To install the motor portion 300 in the casing 500, the motor portion 300 is inserted in the air blowing hole 550 from the bottom surface side of the casing portion 500, and the attaching legs 330 are accommodated in the attaching recessed portions 560. Then, attaching screws are inserted in the attaching holes 335 in the attaching legs 330, and are threadedly engaged with the tapped holes in the casing 500, thereby attaching the motor portion to the casing 500.

This attachment is not limited to screwing, and an arrangement may be alternatively provided such that fixing holes are provided instead of the tapped holes, nuts are provided over the fixing holes, and the screws are passed through the attaching holes 335 and the fixing holes from the rear surface side and are fixed by being threadedly engaged with the nuts. Still alternatively, the holes aligned with each other may be fixed together by eyelets or the like. Furthermore, the two members may be fixed to each other by caulking or the like. Any suitable fixing method is applicable.

In accordance with the second embodiment described above, the thickness of the fan-motor attaching member is not added to the thickness of the fan motor, it is possible to make a fan motor thin.

What is claimed is:

1. A fan motor, which is mounted on a surface of an electronic component to be cooled, said fan motor comprising:

a thermally dissipating surface to be mounted to the electronic component;

the motor attached to said thermally dissipating surface; and an attaching plate having a leg portion in a peripheral portion thereof for fixing said motor to said thermally dissipating surface, wherein said thermally dissipating surface has a hole portion at least as large as said attaching plate, and a recessed portion that is formed on an attaching surface side of said thermally dissipating surface to said electronic component and that accommodates at least said leg portion of said attaching plate therein, wherein said recessed portion has a depth at least as large as a thickness of said leg portion, and wherein a thickness of said thermally dissipating surface is at least equal to a combined thickness of said leg portion and said recessed portion.

2. A method of assembling a fan motor, which is mounted on a surface of an electronic component to be cooled, including a thermally dissipating surface to be mounted to the electronic component, the motor attached to said thermally dissipating surface, and an attaching plate having a leg portion in a peripheral portion thereof for fixing said motor to said thermally dissipating surface, wherein said thermally dissipating surface has a hole portion at least as large as said attaching plate, and a recessed portion that is formed on an attaching surface side of said thermally dissipating surface to said electronic component and that accommodates at least said leg portion of said attaching plate therein, said method comprising:

passing said attaching plate through said hole portion;

rotating the attaching plate through said hole portion;

rotating the attaching plate so that said leg portion is accommodated in said recessed portion, said recessed portion being provided such that said recessed portion has a depth at least as large as a thickness of said leg portion; and fixing said leg portion to said thermally dissipating surface from said attaching surface side, wherein a thickness of said thermally dissipating surface is at least equal to a combined thickness of said leg portion and said recessed portion.

3. The fan motor according to claim 1, wherein said thermal dissipating surface has a retaining portion capable of retaining a signal line, said retaining portion including a tongue portion provided in a central portion thereof and a space portion surrounding said tongue portion to permit the signal line to pass therethrough across said tongue portion, and wherein said retaining portion retains the signal line by allowing the signal line to pass between said tongue portion and said thermally dissipating surface.

4. A fan motor, which is mounted on a surface of an electronic component to be cooled, wherein a recessed portion capable of accommodating an attaching plate of the motor is provided in a thermally dissipating surface of a heat sink on a side thereof which is to be mounted on the electronic component, and said attaching plate is fixed from an attaching surface side of said thermally dissipating surface to the electronic component in a state that said attaching plate is accommodated in said recessed portion, wherein said recessed portion has a depth at least as large as a thickness of said attaching plate portion being accommodated, and wherein a thickness of said thermally dissipating surface is at least equal to a combined thickness of said leg portion and said recessed portion.

5. The fan motor according to claim 4, wherein said thermally dissipating surface has a retaining portion capable of retaining a signal line, said retaining portion including a tongue portion provided in a central portion thereof and a space portion surrounding said tongue portion to permit the signal line to pass therethrough across said tongue portion, and wherein said retaining portion retains the signal line by allowing the signal line to pass between said tongue portion and said thermally dissipating surface.

6. A structure for mounting a first plate member associated with a motor portion of a fan motor, which is mounted on a surface of an electronic component to be cooled, onto a second plate member having a first side and a second side opposite from said first side, said structure comprising:

an opening portion formed through said second plate member;

at least one recessed portion provided in said first side of said second plate member and located outwardly with respect to said opening portion; and at least one leg portion provided to said first plate member, and received by said recessed portion so that said motor portion is at least partially located in said second side, wherein said recessed portion has a depth at least as large as a thickness of said leg portion, and wherein a thickness of said thermally dissipating surface is at least equal to a combined thickness of said leg portion and said recessed portion.

7. The structure according to claim 6, wherein said first plate member includes an attaching plate attached to said fan motor including said motor portion and a motor casing, and said second plate member includes a cooling plate.

8. The structure according to claim 6, further comprising:

at least one notched portion provided to said second plate member to define an outwardly expanded perimeter of said opening portion, said notched portion being adjacent to said recessed portion.

9. The structure according to claim 8, further comprising:

a groove provided to said first side of said second plate member to connect said notched portion to said recessed portion.

10. The structure according to claim 6, wherein three of said recessed portions are provided to said second plate member.

11. The structure according to claim 6, wherein three of said leg portions are provided to said first plate member.

12. The structure according to claim 8, further comprising:

a hole portion provided to said second plate member;

a tongue portion provided to said second plate member and extending in a central portion of said hole portion, said tongue portion being spaced from each of opposing side edges of said hole portion.

13. The structure according to claim 12, wherein said hole portion includes a through-hole.

14. The structure according to claim 12, wherein said hole portion includes a blind-hole.

* * * * *